United States Patent

[11] 3,601,662

[72] Inventor Sydney A. deBarros
Dollard des Ormeaux, Quebec, Canada

[21] Appl. No. 849,131
[22] Filed Aug. 11, 1969
[45] Patented Aug. 24, 1971
[73] Assignee Canadian Marconi Company
Montreal, Quebec, Canada
Continuation-in-part of application Ser. No. 732,367, May 27, 1968, now abandoned.

[54] TERMINATIONS FOR CORDWOOD MODULES
4 Claims, 4 Drawing Figs.

[52] U.S. Cl. .......... 317/101 CC, 29/626, 174/68.5, 317/101 CW, 339/17 C
[51] Int. Cl. .......... H05k 1/18, H05k 3/30
[50] Field of Search .......... 174/68.5, 52.6; 29/626; 339/17, 275; 317/101 C, 101 CC, 101 CM, 101 D

[56] References Cited

UNITED STATES PATENTS

| | | | |
|---|---|---|---|
| 3,121,771 | 2/1964 | Stearns | 174/68.5 |
| 3,123,664 | 3/1964 | Logan | 174/68.5 X |
| 3,163,709 | 12/1964 | Fox | 174/68.5 |

*Primary Examiner*—Darrell L. Clay
*Attorney*—Fetherstonhaugh & Co.

ABSTRACT: Termination means for each lead of a cordwood module which permits easy removal of the module from a circuit board on which it is mounted. The termination means includes a conductive cylinder which is placed over the lead and which is fixed to the circuit board, by soldering, on the side of the circuit board remote from the module. The lead is then soldered to the termination means at its end remote from the module, thereby providing a mechanical and electrical connection between the lead and the circuit board. The termination means is so constructed that, when a cut is made between the two solder joints, the lead is released from the board.

Figure 1:
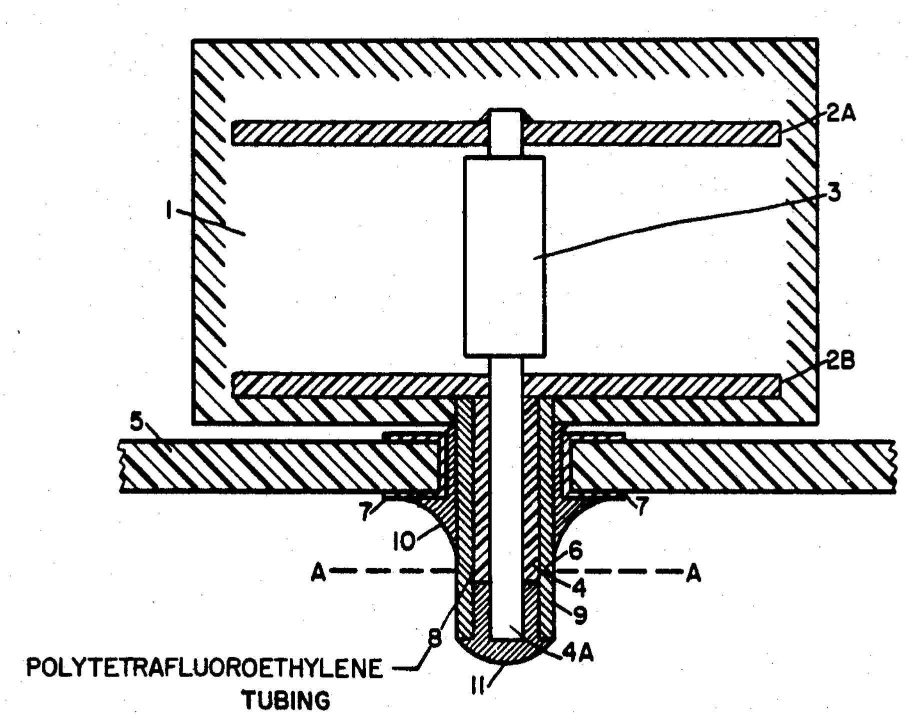

INVENTOR
S. A. de BARROS

Fetherstonhaugh & Co.
ATTORNEYS

INVENTOR
S. A. de BARROS

Fetherstonhaugh & Co.
ATTORNEYS

TERMINATIONS FOR CORDWOOD MODULES

This is a continuation-in-part of copending application Ser. No. 732,367 filed May 27, 1968 for "Terminations for Cordwood Modules," now abandoned.

This invention relates to a novel termination means for components having a plurality of termination leads and adapted to be mounted on mounting boards. More specifically, this invention relates to a termination means which permits easy removal of the component from its mounting board.

Although not restricted thereto, this invention is particularly applicable to termination means for cordwood modules adapted to be mounted on printed circuit boards. At present, the termination means for said modules consist merely of wire leads. When it is desired to mount the modules on printed circuit boards, the leads are inserted through appropriately located holes on the printed circuit board and the leads are then soldered to the board on the side removed from the module. The disadvantage of such a system is that it is exceptionally difficult to remove such a module from the printed circuit board as this requires either the simultaneous unsoldering of a plurality of leads or means for removing the solder from each solder joint as it is unsoldered. As a result, special devices such as multicavity soldering irons, and vacuum operated devices for sucking the solder from the terminations, are necessary items in the repair and maintenance of systems using said cordwood modules. This effectively increases the price of the cordwood module, and makes the repair and maintenance of cordwood modules costly and inconvenient.

Although the use of spring engaging means in the printed circuit board holes, or on the termination means, would eliminate the removal problem, the use of such mounting means would reduce reliability to a level intolerable in such applications as avionic systems, and is thus not a satisfactory solution to the problem.

It is, therefore, an object of the invention to provide a termination means for a component having a plurality of leads, said component being fixedly mounted on a mounting board, which permits easy removal of a fixedly mounted component from said board.

It is a further object of the invention to provide a termination means for a component having a plurality of leads, said component being fixedly mounted on a mounting board, which permits removal of a fixedly mounted component from said board without the aid of special devices.

It is a further object of the invention to provide a termination means for a component having a plurality of leads, said component being adapted to be fixedly mounted on a mounting board, which permits easy removal of a fixedly mounted component from said board without reducing the reliability thereof.

These and other objects, which will be apparent from the following, are achieved by providing a termination means for a component; said component having at least one lead extending therefrom; said termination means comprising a conductive member being placed over said lead along the length thereof, coaxial with and in spaced relationship to said lead; said component being fixedly mounted on one side of a mounting board; said lead being of a length greater than the width of said mounting board and extending beyond the mounting board on the other side thereof; said termination means extending through said mounting board, and beyond said mounting board on the other side thereof; said termination means being fixed, at a first position on said termination means, to said mounting board on the other side thereof; said termination means being fixed, at a second position on said termination means, to said lead at the end of said lead remote from said component; whereby said first and second positions are electrically and mechanically connected and whereby said lead is held captive to said mounting board; said termination means being so constructed that, when it is cut at a position intermediate said first and second positions, the lead will no longer be held captive to said mounting board.

In accordance with one embodiment of the invention, a termination means for a component, said component being fixedly mounted on a mounting board, said component having a plurality of leads extending therefrom on one side thereof, each said lead being of a length greater than the width of said mounting board, is characterized in that said termination means comprises a first member of a material to which solder will not adhere, a separate one of said first members being placed on each of said leads along the length thereof such that at least one portion of each said lead 08c remains uncovered, said portion being at the end of said lead removed from said component, and a conductive member covering at least a portion of said first member, in such a manner that it extends past that end of the first member removed from said component.

In a preferred embodiment of the invention, the first member comprises a cylinder composed of polytetrafluorethylene receiving each said lead such that the lead is slidable within said cylinder, and wherein said conductive member comprises a conductive cylinder.

A feature of the invention is to embed the polytetrafluorethylene cylinder and the conductive cylinder in the component.

In accordance with a second embodiment of the invention, the need for a member to which solder will not adhere is obviated by providing a conductive member which is bent back upon itself whereby to provide an integrated inner and outer member, the two members being coaxial with one another and being spaced from each other along their lengths, the two members being joined together at one end and spaced apart at the other.

The invention is particularly applicable when said component is a cordwood module and wherein said mounting board is a printed circuit board.

Figure 3:
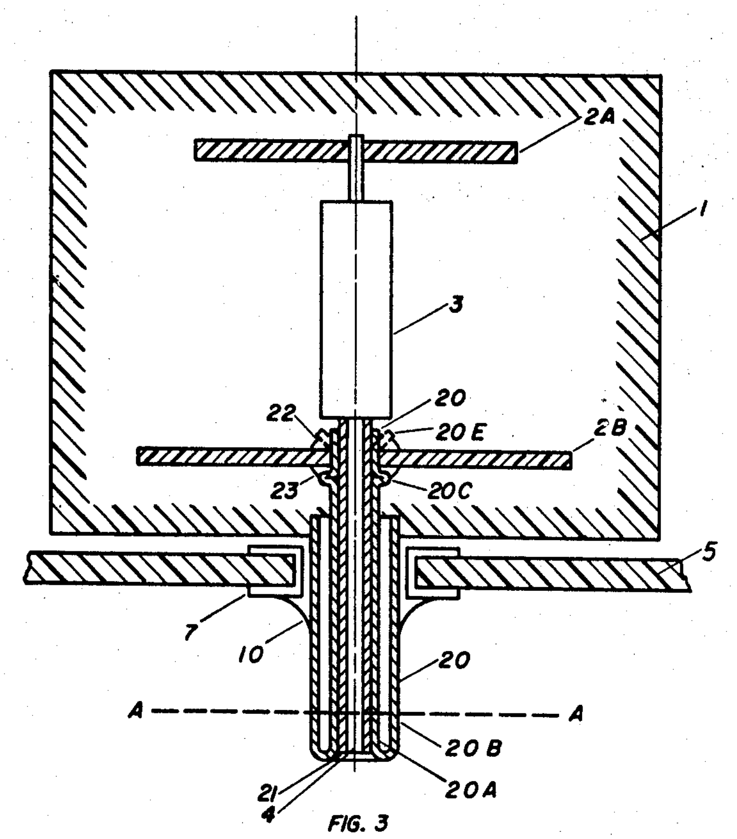
Figure 2A:
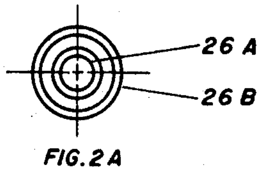
Figure 2B:
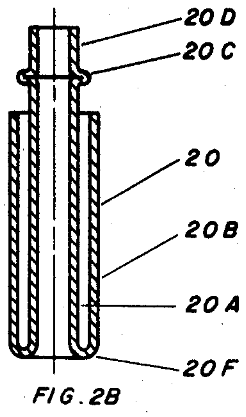

The invention will be better understood by examination of the following description together with the drawings in which:

FIG. 1 illustrates one embodiment of the invention as used in association with a cordwood module;

FIGS. 2*a* and 2*b* are top and side views respectively of another embodiment of the invention; and FIG. 3 illustrates how the embodiment shown in FIG. 2 is used in association with a cordwood module.

Like references denote like parts in all the figures.

In FIG. 1, a cordwood module 1, comprising module printed circuit boards 2A and 2B, and an electrical component 3, which has a lead 4 extending from the module at one side thereof, is shown mounted on a printed circuit board 5 with the lead 4 extending through an opening in the printed circuit board. The printed circuit board has a copper, or other conductive material, pad 7 which covers the surface of the opening and extends on both surfaces of the printed circuit board surrounding an adjacent to the opening. This pad is connected to the printed circuitry on the board as is well known in the art.

The components of the module are embedded in an epoxy material which defines the outside surface of the module. The lead 4 is surrounded by a cylinder 8 which is in turn covered by conductive sleeve 9. The cylinder 8 is made of a material to which solder will not adhere such as plastic. In the preferred embodiment an insert made of polytetrafluoroethylene was used, although the invention is not restricted thereto.

As can be seen, the insert is of such a length as to leave a portion 4A of the lead 4 uncovered for reasons that will be explained below. The metal sleeve, however, must extend past that end of the insert removed from the module. In the preferred embodiment, it is shown extending to that end of the lead removed from the module; however, it may extend beyond the end of the lead, or it may not extend as far as the end of the lead, so long as it extends past the end of the insert.

Although in the preferred embodiment the termination means, comprising the insert 8 and the conductive sleeve 9, is shown embedded in the epoxy material, it is of course possible to provide a separable termination means which would be mounted on the lead after the epoxy is cured and which would, therefore, not be embedded in the epoxy material. However, in this case, the extra precautions of ensuring that the lead fits snugly in the insert, which in turn fits snugly in the conductive sleeve, would have to be taken in order to ensure that movement of the module along the printed circuit board is prevented. Again, in the case of a separate termination means, it is not necessary that the metal sleeve and insert abut the side of the module, but they may extend, for example, only half the width of the printed circuit board.

The module is fixed on the printed circuit board as follows: After the lead, encompassed by the termination means, is inserted in the appropriate opening of the printed circuit board, a solder joint 10 is made between the conductive sleeve 9 and the copper pad 7. This joint provides both an electrical path between the sleeve 9 and the printed circuitry, and a rigid mechanical connection between the sleeve 9 and the printed circuit board 5. A solder joint 11 is then effected between the lead 4 and the sleeve 9 at the bottom end of the lead. This provides an electrical connection from the printed circuitry, through the copper pad 7, through solder joint 10, through sleeve 9, through the solder joint 11, through lead 4, to the module electrical component 3. At the same time, there is a mechanical connection of the lead 4 to the sleeve 9, and, as the sleeve is mechanically connected to the printed circuit board, the lead and electrical component and module are rigidly fastened to the printed circuit board.

When it is required to remove the module from the printed circuit board, the termination means is cut at a point above the solder joint 11, for example at A—A. The wire will no longer be mechanically connected to the sleeve so that it will be possible to slide the wire out of the termination means and remove the module from the printed circuit board. As can be seen, with this method, only a pair of clippers is required to effect removal of the module from the board. Nevertheless, when the module is fixedly mounted on the board, it has all the features and reliability of a soldered joint.

Referring now to FIG. 2, which illustrates a second embodiment consisting of a member 20 which comprises an inner member 20A and an outer member 20B joined at the bottom by portion 6F. The member 20B is formed by bending the cylinder back on itself. A shoulder 20C is formed, for example, by pressing, and is used as will be explained below.

Referring now to FIG. 3, the member 20 covers the component lead 4 and is embedded in the epoxy material of the cordwood module 1. The shoulder 20C fits flush against the module printed circuit board 2B and the portion 20D is bent over and the portions 20C and 20E are soldered to the board 2B by solder joints 23 and 22 respectively (as shown in dotted lines 20E) to secure the member 20 to the module printed circuit board. As can be seen, the uppermost part of the outer member 20B is also embedded in the epoxy material of the cordwood module.

The member 20 extends through the hole in the printed circuit board 5 covering the lead 4 which also extends through the same hole. Solder joint 21, connects the lead 4 to the inner member 20A. As can be seen, the solder runs up the entire length of the lead 4. A second solder joint 10 connects the outer member 20B to a conductive pad 7 of the printed circuit board 5. Thus, there is provided both a mechanical and electrical connection between the printed circuit board and the lead 4 through the bottom portion 20F.

When it is desired to release the cordwood module from the printed circuit board, a cut is made through AA. This removes the portion 20F and provides a mechanical separation as between the inner and outer members so that the lead 4 is no longer held captive to the printed circuit board.

While the invention has been described with reference to a module having only one lead, it is, of course, understood that this was for ease of illustration only, and the invention is especially applicable to modules having a plurality of leads.

The invention is also applicable to discrete components having a plurality of leads, or to any microreplaceable assembly having a plurality of leads.

While particular embodiments have been described, it is to be understood that this is for the purpose of illustrating, but not restricting, the invention, and various modifications which will come readily to the mind of one skilled in the art are considered to fall within the scope of the invention.

I claim:

1. Termination means for a component; said component having at least one lead extending therefrom; said termination means comprising a conductive cylinder and a second cylinder composed of polytetrafluorethylene; said conductive cylinder being placed over said lead along the length thereof, coaxial with and in spaced relationship to said lead; said component being fixedly mounted on one side of a mounting board; said lead being of a length greater than the width of said mounting board and extending through an opening in said mounting board and beyond the mounting board on the other side thereof; said conductive cylinder extending through said opening in said mounting board, and beyond said mounting board on the other side thereof; said conductive cylinder being soldered at a first position on said conductive cylinder to said mounting board; said conductive cylinder being soldered at a second position on said conductive cylinder to said lead at the end of said lead remote from said component; said first and second positions being axially spaced along said conductive cylinder; said second cylinder being placed on said lead along the length thereof and between said lead and said conductive cylinder; the length of said second cylinder being less than the length of said lead, whereby a first portion of said lead is covered by said second cylinder and a second portion of said lead is not covered by said second cylinder; said second portion being at the end of said lead removed from said component; said conductive cylinder covering at least a portion of said second cylinder and extending past that end of the second cylinder removed from said component; said lead being slidable within said second cylinder; whereby a first electrical and mechanical connection is made between said conductive cylinder and said mounting board at said first soldered position, and a second electrical and mechanical connection is made between said conductive cylinder and said lead at said second soldered position, thereby providing electrical and mechanical connections between said lead and said mounting board through said first connection, said conductive cylinder and said second connection, whereby said component is held captive to said mounting board and whereby, when said termination means is broken at a third position intermediate said first and second position, and said lead is broken at a position adjacent said third position, said component will no longer be held captive to said board.

2. Termination means as defined in claim 1 wherein said cylinder of polytetrafluoroethylene and said conductive cylinder are partially embedded in said component.

3. Termination means for a component comprising a conductive cylinder bent back upon itself providing integrated inner and outer members; the inner and outer members being coaxial with one another and being spaced from each other along their lengths; the inner and outer members being joined together at one end and spaced apart at the other end, said other end being placed adjacent said component; said component having at least one lead extending therefrom; said conductive cylinder being placed over said lead along the length thereof, coaxial with and in spaced relationship to said lead; said component being fixedly mounted on one side of a mounting board; said lead being of a length greater than the width of said mounting board and extending through an opening in said mounting board and beyond the mounting board on the other side thereof; said termination means extending through said opening in said mounting board, and beyond said mounting board on the other side thereof; said termination means being fixed, at a first position on said termination means, to said mounting board, said termination means being fixed, at a second position on said termination means, to said lead at the end of said lead remote from said component; whereby said first and second positions are electrically and mechanically connected and said component is thereby held captive to said mounting board; and whereby when said termination means is broken at a third position intermediate said first and second positions, and said lead is broken at a position adjacent said third position, the component will no longer be held captive to said mounting board.

4. Termination means as defined in claim 3 wherein said conductive cylinder further comprises a shoulder means adjacent said other end.